United States Patent [19]

Takabayashi

[11] Patent Number: 4,857,927

[45] Date of Patent: Aug. 15, 1989

[54] DITHER CIRCUIT HAVING DITHER LEVEL CHANGING FUNCTION

[75] Inventor: Osamu Takabayashi, Hamamatsu, Japan

[73] Assignee: Yamaha Corporation, Hamamatsu, Japan

[21] Appl. No.: 942,974

[22] Filed: Dec. 16, 1986

[30] Foreign Application Priority Data

Dec. 27, 1985 [JP] Japan .................................. 60-201346

[51] Int. Cl.⁴ ............................................. H03M 1/20
[52] U.S. Cl. .................................... 341/131; 341/144; 341/155; 341/200
[58] Field of Search ....... 340/347 AD, 347 M, 347 C, 340/347 CC, 347 DR; 341/126, 131, 144, 155, 200

[56] References Cited

U.S. PATENT DOCUMENTS 3,577,123  5/1971  Taylor et al. ........... 340/347 DA X
4,490,714  12/1984  van de Plassche et al. ........ 340/347 DA

OTHER PUBLICATIONS

Ando et al., Article Concerning the Application of Dither to Audio Signals, The Journal of the Acoustical Society of Japan, vol. 39, No. 7, 1983, pp. 452–462.

Primary Examiner—William M. Shoop, Jr.
Assistant Examiner—Brian K. Young
Attorney, Agent, or Firm—Spensley Horn Jubas & Lubitz

[57] ABSTRACT

A dither circuit for improving linearity in A/D or D/A conversion by adding dither to an input signal of an A/D or D/A converter and subtracting dither from an output signal of the A/D or D/A converter. The dither circuit comprises a dither generator for supplying dither to the input and output signals for addition and subtraction of the dither and dither level changing means for detecting the level of the input signal to the A/D or D/A converter for controlling the dither generator to change the level of dither supplied by the dither generator, in accordance with the level of the input signal. The level of dither is controlled to increase as the level of the input signal decreases and to decrease as the level of the input signal increases.

18 Claims, 2 Drawing Sheets

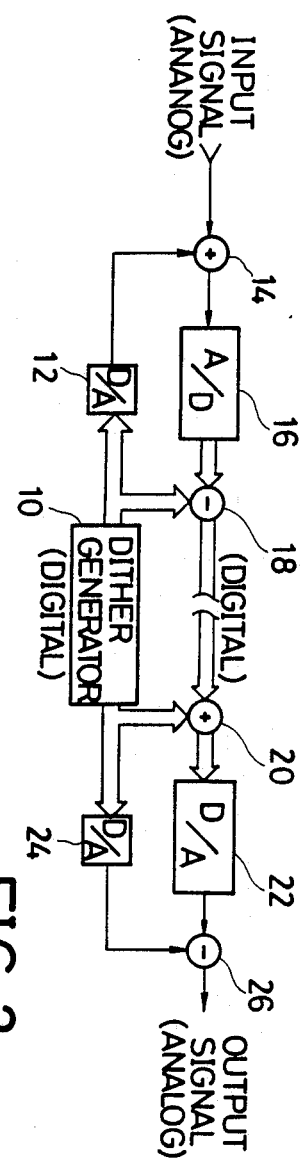
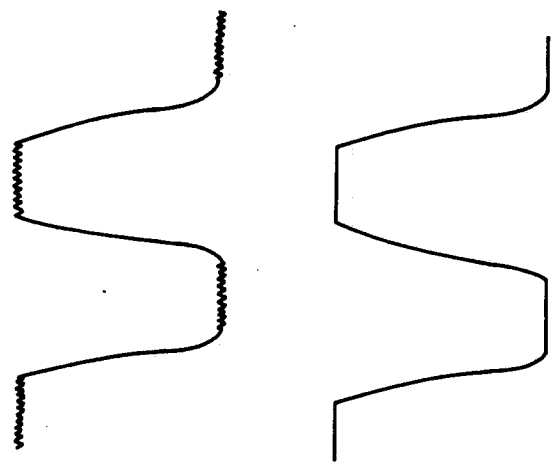
FIG.2
FIG.3
FIG.4

DITHER CIRCUIT HAVING DITHER LEVEL CHANGING FUNCTION

BACKGROUND OF THE INVENTION

This invention relates to an improvement in a dither circuit employed for improving linearity in analog-to-digital(A/D) or digital-to-analog (D/A) conversion of a signal and, more particularly, to a dither circuit capable of preventing occurrence of residual dither component in an output signal from an A/D or D/A converter in a case where clipping has occurred in the level of an input signal to be converted.

In a quantizing operation in A/D conversion, partial missing of information in the quantized output signal is inevitable because continuously distributed sampled values in an input signal are expressed by dispersed values in the quantized output signal. This difference between the quantized output signal and the input sampled values becomes a quantizing noise which is an inherent restriction in the digita signal processing. As is well known, the quantizing noise becomes a white noise which is uncorrelated with a signal to be converted if the signal is of a large level whereas the quantizing noise becomes distortion which is greatly correlated with the signal if the signal is of a relatively small level and this noise adversely affects the quality of tone when the signal is sounded in an audio apparatus.

For overcoming this problem, employment of a dither circuit with an A/D converter is proposed. The dither circuit is provided for uncorrelating quantizing noise with a signal to be converted by superposing dither (random noise) for LSB (least significant bit) one bit on an input signal before A/D conversion and subtracting dither component from a digital signal after the A/D conversion. Further, for uncorrelating not only quantizing error but also conversion error caused by, e.g., manufacturing error in an A/D converter and a D/A converter, a proposal is made for imposing a large amplitude dither which consists of random noise of integer multiple of LSB one bit on an input signal before A/D or D/A conversion and subtracting dither component from a converted output.

A general construction of a dither circuit is shown in FIG. 2. In FIG. 2, an input analog signal is A/D converted and its output digital signal is D/A converted to an analog signal again.

In FIG. 2, a dither generator 10 outputs dither (random noise) in digital. Dither is converted to an analog signal by a D/A converter 12 and thereafter is superposed on an input analog signal by an adder 14. The input signal superposed with dither is converted to a digital signal by an A/D converter 16. Dither component is subtracted from the converted digital signal by a subtractor 18 whereby a digital signal corresponding to the input analog signal is derived.

Dither is superposed on an input digital signal to a D/A converter 22 by an adder 20. The signal superposed with dither is converted to an analog signal by a D/A converter 22. Dither is converted to an analog signal by a D/A converter 24 and subtracted from an output analog signal from the D/A converter 22 by a subtractor 26 whereby an analog signal corresponding to the input digital signal is derived.

In a dither circuit, for sufficiently achieving the dither effect of uncorrelating quantizing error and conversion error effectively, a relatively large level of dither is required. When the input signal has reached a level at which clipping occurs, a simply clipped output signal is produced as shown in FIG. 3 if there is no dither applied to the input signal. When, however, the input signal has reached a level at which clipping occurs in a state in which dither has been superposed on the input signal, an accurate subtraction of dither from the output signal cannot be made with a result that dither component remains in the output signal as shown in FIG. 4 and is heard as noise. Even if the level of the input signal itself has not reached a clipping level, the level of the input signal superposed with dither will reach the clipping level if the level of dither is large enough and the above described problem will likewise arise.

It is, therefore, an object of the invention to provide a dither circuit capable of preventing remaining of dither component in a converted output signal in A/D or D/A conversion due to reaching of an input signal superposed with dither to a clipping level when the level of the input signal is relatively large.

SUMMARY OF THE INVENTION

For achieving the above described object of the invention, it is a basic feature of the invention to change the level of dither in response to the level of an input signal. The change in the level of dither is made progressively in two or more stages or continuously and includes a case where the level of dither is reduced to zero.

A dither circuit achieving the object of the invenion is characterized in that it comprises an A/D or D/A converter, an adder provided in a prior stage to the A/D or D/A converter, a subtractor provided in a posterior stage to the A/D or D/A converter, a dither generator for supplying dither to the adder and subtractor, and dither level changing means for detecting the level of an input signal to the A/D or D/A converter and controlling the dither generator to change the level of dither supplied by the dither generator in accordance with the detection result of the level of the input signal to the A/D or D/A converter.

According to the invention, since the level of dither is changed in response to the level of an input singal, reaching of the level of an input signal superposed with dither to a clipping level can be prevented by decreasing the level of dither so that remaining of dither component in a converted output from an A/D or D/A converter can be prevented. As the level of an input signal becomes larger, quantizing noise or conversion noise becomes uncorrelated with an input signal and, accordingly, decrease in the level of dither does not adversely affect the characteristics of the output signal.

BRIEF DESCRIPTION OF THE DRAWINGS

In the accompanying drawings,

FIG. 2 is a block diagram showing a construction of an A/D converter and a D/A converter provided with a dither circuit;

FIG. 3 is a waveform diagram showing a waveform of an output signal in which clipping has occurred in an input signal in a state in which dither has not been superposed thereon;

FIG. 4 waveform diagram showing a waveform of an output signal in which clipping has occurred in an input signal in a state in which dither has been superposed thereon by the prior art dither circuit;

DESCRIPTION OF PREFERRED EMBODIMENTS

Figure 1:
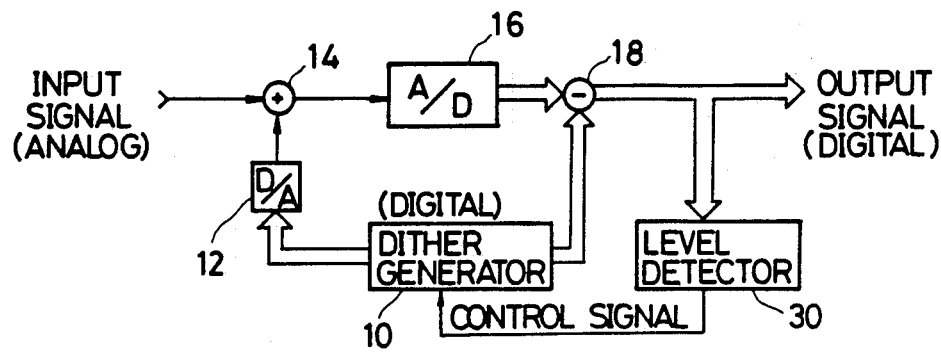
FIG. 1 is block diagram showing an embodiment of the invention applied to an A/D converter.

An embodiment of the dither circuit according to the invention applied to an A/D converter is shown in FIG. 1.

In FIG. 1, a dither generator 10 outputs dither (random noise) as a digital signal. Dither is converted to an analog signal by a D/A converter 12 and superposed on an input analog signal by an adder 14. The input analog signal superposed with dither is converted to a digital signal by an A/D converter 16. Dither is subtracted from the converted digital signal by a subtractor 18 whereby a digital signal corresponding to the input analog signal is derived.

A level detector 30 connected to the subtractor 18 detects whether the level of the digital signal after subtraction of dither is above or below a predetermined level (e.g., a level above which the character of the output signal is not unsatisfactory even if there is no dither superposed on the input analog signal) and, in response to the detected level, applies a control signal to the dither generator 10 for automatically switching on or off the dither generator 10, i.e., switching it on when the signal level is below the predetermined level and switching it off when the signal level is above the predetermined level. Accordingly, addition and subtraction of dither with respect to the input signal is performed when the signal level is below the predetermined level and the dither effect thereby is obtained. When the signal level is above the predetermined level, addition and subtraction of dither is stopped so that no dither component exists in the output signal even if clipping has occurred in the input signal. If te signal level is relatively large, quantizing error and conversion error become uncorrelated with the input signal so that no adverse effect occurs in characteristics of the output signal.

The level detector 30 may be constructed in such a manner that, instead of simply switching on and off the dither generator 10, the level detector 30 continuously variably controls the level of dither in accordance with the level of the input signal (i.e., increasing the level of dither as the level of the input signal decreases and decreasing the level of dither as the level of the input signal increases). The smaller the level of the input signal, the larger must be the level of dither in order to uncorrelate the noise with the input signal so that this arrangement can satisfactorily supply dither of a large level when the level of the input signal is small.

Figure 5:
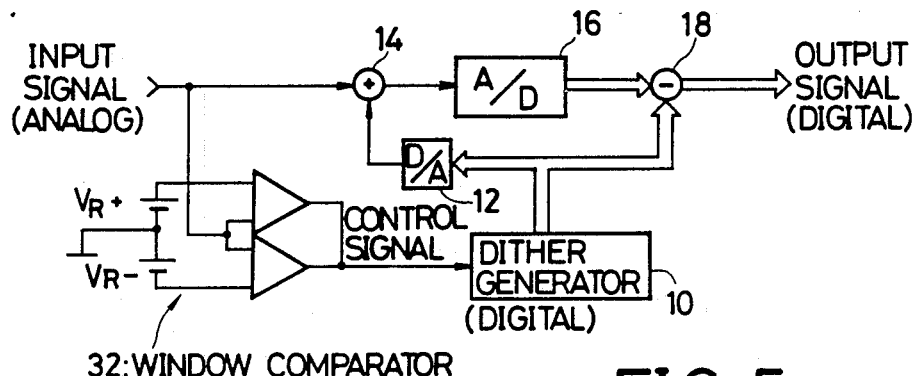
FIG. 5 is block diagram showing another embodiment of the invention applied to an A/D converter.

Another embodiment of the invention applied to an A/D converter is shown in FIG. 5. Since the level detection is performed after A/D conversion in the previously described embodiment, control of the dither generator 10 is delayed by one sample. In the present embodiment, the control of the dither generator 10 is performed in real time.

In FIG. 5, the dither circuit 10 outputs dither as a digital signal. Dither is converted to an analog signal by a D/A converter 12 and superposed upon an input analog signal by an adder 14. The input signal superposed with dither is converted to a digital signal by an A/D converter 16. Dither is subtracted from the converted digital signal by a subtractor 18 whereby a digital signal corresponding to the input analog signal is derived.

A window comparator 32 detects the level of the input signal and applies a control signal to the dither generator 10 which switches on the dither generator 10 when the level of the input signal is within the range of $V_{R-}$ and $V_{R+}$ whereas the window comparator 32 applies a control signal to the dither generator 10 which switches off the dither generator 10 when the level of the input signal is out of this range between $V_{R-}$ and $V_{R+}$. The levels $V_{R-}$ and $V_{R+}$ are establised at levels at which the characteristics of the output signal are not unsatisfactory even if there is no dither superposed on the input signal.

In the same manner as in the previously described embodiment, when the signal level is relatively small, dither is added and subtracted with respect to the input signal so that the dither effect is obtained whereas when the signal is relatively large, addition and subtraction of dither is stopped so that dither component does not exist in the output signal even if clipping has occurred in the input signal.

The window comparator 32 may be provided in plural stages so that the level of dither will be controlled in plural stages in accordance with the level of the input signal (the level of dither increases as the level of the input signal decreases and the level of dither decreases as the level of the input signal increases).

Figure 6:
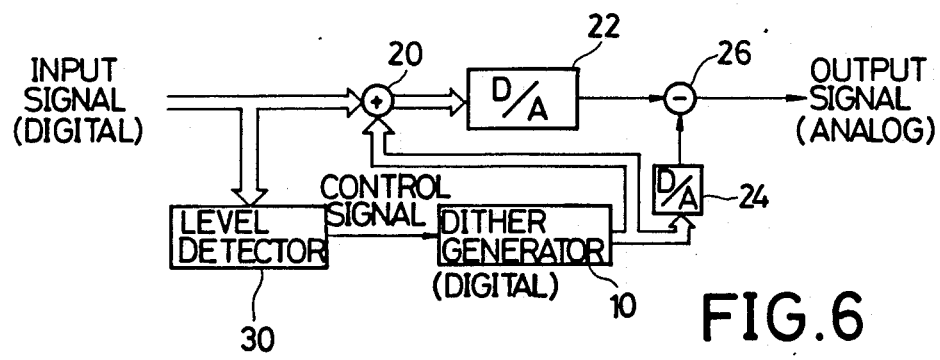
FIG. 6 is a block diagram showing still another embodiment of the applied to a D/A converter.

Another embodiment of the invention applied to a D/A converter is shown in FIG. 6.

In FIG. 6, a dither generator 10 outputs dither as a digital signal. Dither is superposed on an input digital signal by an adder 20. The input digital signal superposed with dither is converted to an analog signal by a D/A converter 22. Dither is converted to an analog signal by a D/A converter 24. Dither is subtracted from the output analog signal of the D/A converter 22 by a subtractor 26 whereby an analog signal corresponding to the input digital signal is derived.

A level detector 30 detects whether the level of the input signal is above or below a predetermined level (e.g., a level above which characteristics of the output signal is not unsatisfactory even if there is no dither superposed on the input signal) and supplies a control signal to the dither generator 10 for automatically switching on or off the dither generator 10. Accordingly, dither is added and subtracted with respect to the input signal when the level of the input signal is below the predetermined level and the dither effect thereby is obtained. When the level of the input signal is above the predetermined level, addition and subtraction of dither is stopped so that no dither component exists even if clipping has occurred in the input signal.

The level detector 30 may be constructed in such a manner that instead of simply controlling switching on and off of the dither generator 10, the level detector 30 will continuously variably control the level of dither in accordance with the level of the input signal (the level of dither increases as the level of the input signal decreases and the level of dither decreases as the level of the input signal increases).

What is claimed is:

1. A dither circuit comprising:
and A/D converter;
an adder provided in a prior stage to said A/D converter;

a subtractor provided in a posterior stage to said A/D converter;

a dither generator for supplying dither to said adder and subtractor and, dither level changing means for detecting the level of an input signal to said A/D converter for controlling said dither generator to change the level of dither supplied by said dither generator in accordance with the level of the input signal to said A/D converter.

2. A dither circuit as defined in claim 1 wherein said dither level changing means controls the level of dither stepwise in accordance with the level of the input signal to said A/D converter in such a manner that the level of dither increases as the level of the input signal decreases and the level of dither decreases as the level of the input signal increases.

3. A dither circuit as defined in claim 1 wherein said dither level changing means continuously variably controls the level of dither in accordance with the level of the input signal to said A/D converter in such a manner that the level of dither increases as the level of the input signal decreases and the level of dither decreases as the level of the input signal increases.

4. A dither circuit as defined in claim 2 wherein said dither level changing means reduces the level of dither supplied from said dither generator to zero when the level of the input signal to said A/D converter has reached a predetermined level above which clipping occurs in the input signal to said A/D converter which has been superposed with the dither.

5. A dither circuit as defined in claim 3 wherein said dither level changing means reduces the level of dither supplied from said dither generator to zero when the level of the input signal to said A/D converter has reached a predetermined level above which clipping occurs in the input signal to said A/D converter which has been superposed with the dither.

6. A dither circuit as defined in claim 1 wherein said dither level changing means comprises a level detector provided in a posterior stage to said subtractor for detecting the level of the input signal to said A/D converter after subtraction of dither.

7. A dither circuit as defined in claim 1 wherein said dither level changing means comprises a level detector provided in a prior stage to said adder for detecting the level of the input signal to said A/D converter before addition of dither.

8. A dither circuit as defined in claim 6 wherein said level detector comprises a window comparator.

9. A dither circuit as defined in claim 7 wherein said level detector comprises a window comparator.

10. A dither circuit comprising:
a D/A converter;
an adder provided in a prior stage to said D/A converter;
a substractor provided in a posterior stage to said D/A converter;
a dither generator for supplying dither to said adder and subtractor; and
dither level changing means for detecting the level of an input signal to said D/A converter for controlling said dither generator to change the level of dither supplied by said dither generator in accordance with the level of the input signal to said D/A converter.

11. A dither circuit as defined in claim 10 wherein said dither level changing means controls the level of dither stepwise in accordance with he level of the input signal to said D/A converter in such a manner that the level of dither increases as the level of the input signal decreases and the level of dither decreases as the level of the input signal increases.

12. A dither circuit as defined in claim 10 wherein said dither level changing means continously variably controls the level of dither in accordance with the level of the input signal to said D/A converter in such a manner that the level of dither increases as the level of the input signal decreases and the level of dither decreases as the level of the input signal increases.

13. A dither as defined in claim 11 wherein said dither level changing means reduces the level of dither supplied from said dither generator to zero when the level of the input signal to said D/A converter has reached a predetermined level above which clipping occurs in the input signal to said D/A converter which has been superposed with the dither.

14. A dither circuits defined in claim 12 wherein said dither level changing means reduces the level of dither supplied from said dither generator to zero when the level of the input signal to said D/A converter has reached a predetermined level above which clipping occurs in the input signal to said D/A converter which has been superposed with the dither.

15. A dither circuit as defined in claim 10 wherein said dither level changing means comprises a level detector provided in a posterior stage to stage subtractor for detecting the level of the input signal to said D/A converter after subtraction of dither.

16. A dither circuit as defined in claim 10 wherein said dither level changing means comprises a level detector provided in a prior stage to said adder for detecting the level of the input signal to said D/A converter before addition of dither.

17. A dither circuit as defined in claim 15 wherein said level detector comprises a window comparator.

18. A dither circuit as defined in claim 16 wherein said level detector comprises a window comparator.

* * * * *